US007342451B2

(12) United States Patent
Brueske

(10) Patent No.: US 7,342,451 B2
(45) Date of Patent: Mar. 11, 2008

(54) SYSTEM FOR LOGARITHMICALLY CONTROLLING MULTIPLE VARIABLE GAIN AMPLIFIERS

(75) Inventor: Daniel Brueske, Sammamish, WA (US)

(73) Assignee: Siemens Medical Soluitions USA, Inc., Malvern, PA (US)

( * ) Notice: Subject to any disclaimer, the term of this patent is extended or adjusted under 35 U.S.C. 154(b) by 205 days.

(21) Appl. No.: 11/197,929

(22) Filed: Aug. 5, 2005

(65) Prior Publication Data

US 2007/0030067 A1 Feb. 8, 2007

(51) Int. Cl.
*H03F 3/45* (2006.01)

(52) U.S. Cl. ........................................................ 330/254

(58) Field of Classification Search ................ 330/254; 327/346, 350

See application file for complete search history.

(56) References Cited

U.S. PATENT DOCUMENTS 4,292,569 A 9/1981 Gerry
4,667,166 A 5/1987 Itoh
4,816,772 A 3/1989 Klotz
5,404,097 A 4/1995 Barou
5,510,738 A 4/1996 Gorecki et al.
5,572,166 A 11/1996 Gilbert
5,573,001 A 11/1996 Petrofsky et al.
5,952,880 A * 9/1999 Voorman et al. ............ 330/254
5,994,961 A 11/1999 Lunn et al.
5,999,053 A 12/1999 Eschauzier
6,078,169 A 6/2000 Petersen
6,172,636 B1 1/2001 Murden et al.
6,639,457 B1 10/2003 Lou
6,784,737 B2 8/2004 Martin et al.
6,853,249 B2 2/2005 Cyrusian
6,894,564 B1 5/2005 Gilbert
7,075,369 B2 7/2006 Takenaka

OTHER PUBLICATIONS

Andreas Andreou and Kwabena A. Boahen, "Translinear Circuits in Subthreshold MOS," Analog Integrated Circuits and Signal Processing; vol. 9, No. 2, Mar. 1996.

B. Gilbert, "Current-Mode Circuits from a Translinear Viewpoint: a Tutorial." Chapter 2 of C. Toumazou, F. J. Lidgey and D.G. Haigh, eds., Analogue IC Design: The Current-Mode Approach, IEEE Circuits and Systems Series, vol. 2. Peter Peregrinus Ltd: London, 1990, pp. 11-21.

B. Gilbert, "Translinear circuits: A proposed classification." *Electronic Letters*, 11(1), pp. 14-16, 1975: errata, 11(6), p. 136.

* cited by examiner

*Primary Examiner*—Robert Pascal
*Assistant Examiner*—Hieu Nguyen

(57) ABSTRACT

A system for producing a control signal to a plurality of amplifiers sections to vary the gain of each one of the plurality of amplifier sections as a linear natural logarithmic function of an input gain control signal. The system includes a master circuit for producing a pair of currents with a ratio proportional to the linear natural logarithmic function of the input gain signal and a differential voltage. Each one of the amplifier sections includes: a replica of a portion of the master circuit fed by the produced differential voltage for producing a pair of currents produced in the master circuit; and an amplifier fed by the produced replicated currents, such amplifier having a gain proportional to the ratio of such replicated currents.

11 Claims, 6 Drawing Sheets

SYSTEM FOR LOGARITHMICALLY CONTROLLING MULTIPLE VARIABLE GAIN AMPLIFIERS

REFERENCE TO RELATED APPLICATIONS

The present patent document is related to U.S. patent application Ser. No. 11/198,740, AMPLIFIER CIRCUIT, Brueske et al., which is filed concurrently with the present application, is commonly assigned with the present application, and is hereby incorporated by reference in its entirety.

TECHNICAL FIELD

This invention relates generally to variable gain amplifiers and more particularly to amplifiers having gain that varies exponentially (i.e., as a linear natural logarithmic function) of a gain control signal.

BACKGROUND

As is known in the art, variable gain amplifiers are used in a wide range of applications. One such application is in transducer array systems, such as, for example, ultrasound imaging, sonar, and radar. With such systems, pulses of wave energy are transmitted and are returned as echo signals to a receiver. More particularly, the electrical signals produced in response to reception of the echo signals are converted into electrical signals and are then fed to amplifiers for post-processing signal conditioning. As is known in the art, such amplifiers may include a time gain control wherein the gains of the amplifiers are adjusted as a function of the time after transmission of the echo pulse; i.e., the amplifiers have gain variations as a function of time, i.e., time gain control.

In many applications it is required that the gain of the amplifiers be adjusted as an exponential (i.e., as a linear natural logarithmic) function of time. For example, in some ultrasound applications, it is highly desirable to control the gain in a variable gain amplifier (VGA) which grows exponentially with the control signal; i.e. 50 dB of gain change for every 1 volt change in the control signal. This allows the control signal to exist in a reasonable range of signals for a very wide range in gain change (>40 dB or factor greater than 100). Active or passive signal interpolative methods have been used in the past with gain controllers. Control is achieved by manipulating the level of interpolation. For example, a programmable resistor divider can be used to attenuate the signal depending upon the selected resistors. The resistor divider would be programmed by switches controlled by some register. Thus using interpolation has the advantage of being very flexible in terms of the gain curve. The points along the gain curve can be manipulated by simply adjusting the register setting.

Another common method of gain control is to generate the control signal using a simple bipolar junction transistor (BJT) which has an inherent exponential response. This is convenient because it intrinsically creates a dB/V curve. FIG. 1 shows a circuit which illustrates this type of controller. The controller is basically Q0. The current I1 is given by Q0 which is equal to $$I1 = Is_0 e^{\frac{(Vcc-Vtgc)}{Vt}},$$

where: Iso is the saturation current; Vcc is the collector voltage, and Vt is equal to kT/q, where k is Boltzmann's constant, q is the charge on the electron and T is absolute temperature in degrees Kelvin ($V_T$ evaluates to approximately 26 mV at 300° K.).

The gain of the circuit shown in FIG. 1 is given by $$Vout/Iin = \left(1 - \frac{Is_0}{It} e^{\frac{Vcc-Vtgc}{Vt}}\right) Rfb1,$$

where Vtgc is the voltage at the base electrode of Q0, i.e., $V_{be}$. This can therefore be approximated as an exponential gain controller.

The interpolative method mentioned above, requires a trade off of range for complexity and size. As the desired controller dynamic range increases, the more programmable switches and interpolative stages are required. This can become costly for large dynamic ranges and where the array of tranducers requires dense amplification channel designs.

While the BJT type of controller of FIG. 1 can handle large ranges, it does not have an ideal exponential curve thus some kind of compensation may be required to handle the portion of the curve which is not exponential. This is due to the constant 1 in the equation $$\left(1 - \frac{Is_0}{It} e^{\frac{Vcc-Vtgc}{Vt}}\right).$$

The BJT type controller, while compact and cost effective, has temperature effects as well and may not provide the required ideal exponential gain relationship.

SUMMARY

In accordance with the present invention, a system is provided for producing a control signal to a plurality of amplifiers sections to vary the gain of each one of the amplifier sections as a linear natural logarithmic function of an input gain control signal. The system includes a master circuit for producing: a pair of currents with a ratio proportional to the linear natural logarithmic function of the input gain signal; and, a differential voltage. Each one of the amplifier sections includes: (a) a replica of a portion of the master circuit and is fed by the produced differential voltage to thereby produce a replica of the pair of currents produced in the master circuit; and (b) an amplifier fed by the produced replicated pair of currents, such amplifier having a gain proportional to the ratio of such replicated currents.

With such arrangement, because the gain of the amplifier is proportional to the ratio of such replicated currents and since the ratio of the replicated pair of currents is proportional to the linear natural logarithmic function of the input gain signal, the gain of the amplifier varies proportionally with the linear natural logarithmic function of the input gain signal.

In accordance with another feature of the invention, a circuit is provided for producing a pair of currents having a ratio proportional to the natural logarithm of an input signal. The circuit includes a differential pair of transistors. Each one of the transistors in the differential pair has a control electrode for controlling carriers between a first electrode thereof and a second electrode thereof. The first electrodes of the pair are fed a common current. The control electrode of a first one of the pair of transistors is adapted for connection to a first reference potential. A current feedback circuit is fed by a first current passing through the second electrode of one of the pair of transistors for producing a corresponding feedback current. A translinear loop is fed by both the input signal and the feedback current and produces a second current through a second electrode of another one of the pair of transistors proportional to the natural logarithm of the input signal. The first and second currents provide the pair of currents having the ratio proportional to the natural logarithm of the input signal. A control circuit is provided for controlling the control electrode of the second one of the pair of transistors to a second potential in response to one of the pair of currents.

In one embodiment, the translinear loop comprises a first PN junction connected to a second PN junction through a resistive element. The resistive element passes therethrough a input current. The input current provides the input signal. A first one of the PN junctions passes the feedback current and a second one of the pair of PN junctions passing the second current.

In one embodiment, the control circuit includes a feedback loop responsive to one of the currents passing through the first one of the pair of PN junctions.

In one embodiment, bipolar junction transistors (BJTs) provide the PN junctions.

With such an arrangement, a circuit is provided which has a pure linear in dB response to the gain curve, compact design, and, since all of it is analog, is applicable to any amplifier stage where a current or voltage ratio type of attenuator or gain is used.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 2:
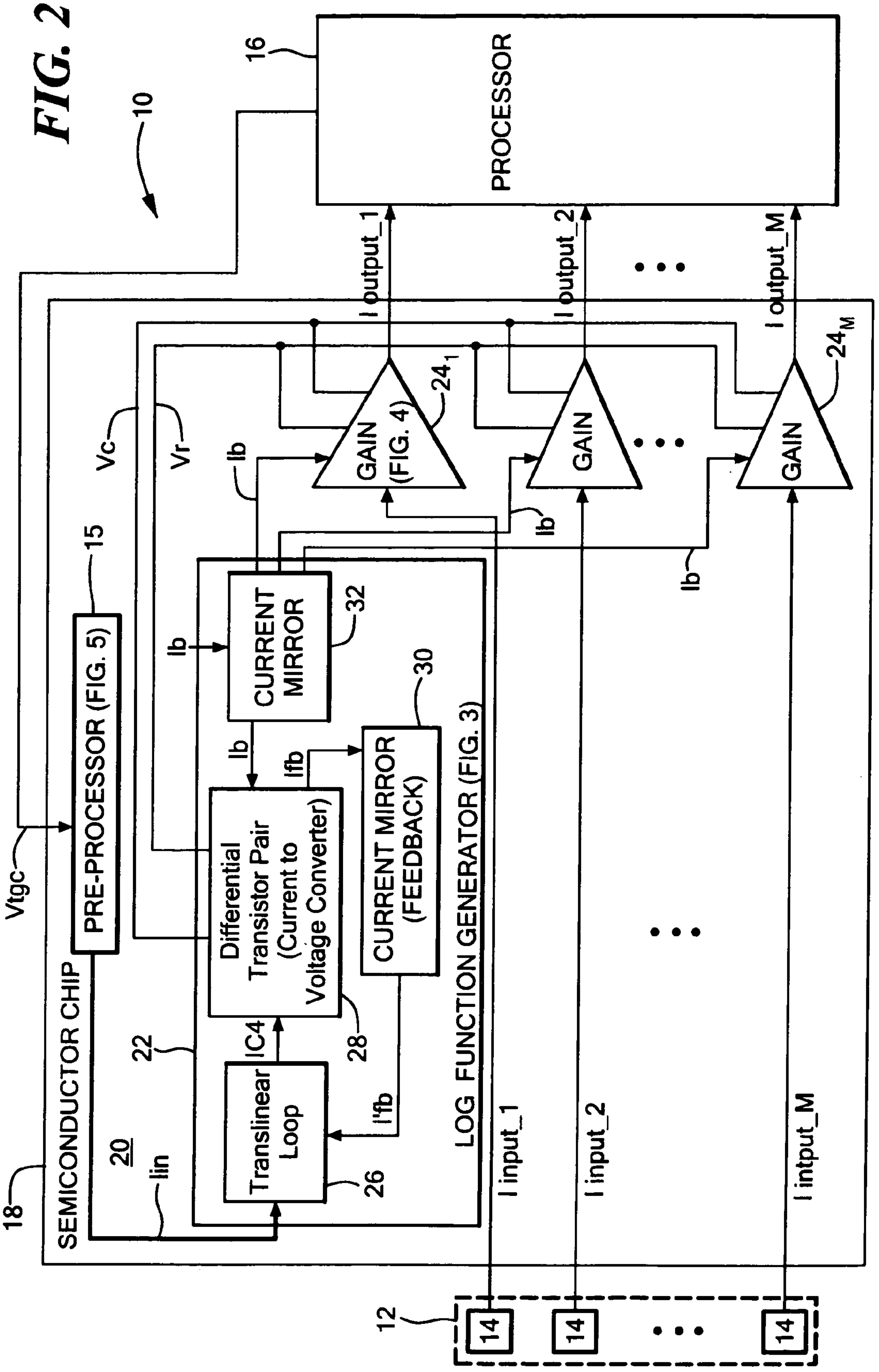
FIG. 2 is a diagram of a system having an array of transducer elements for providing a variable gain to signals produced by such transducer elements in accordance with the invention.

Referring now to FIG. 2, a system 10 is shown having an array 12 of transducer elements 14, fed to a processor 16 through an amplification section 18. The amplification section 18 provides a variable gain to signals produced by the transducer elements 14, such gain varying in accordance with a control signal Iin. As will be described in connection with FIG. 5, the control signal Iin is a function of a control voltage, Vtgc, provided by the processor 16 to the amplification section 18.

The amplification section 18 is formed on a single semiconductor chip 20 and includes, in addition to the pre-processor 15 to be described in connection with FIG. 5, a natural log function generator 22, fed by a control signal Iin produced by the pre-processor 15, and a plurality of identical amplifier sections $\mathbf{24}_1$-$\mathbf{24}_M$. While, as noted above, the pre-processor will be described in more detail in connection with FIG. 5, suffice it to say here that such pre-processor 15 is used to calibrate the system by providing any requisite slope and offset adjustments as well as temperature compensation. The log function generator 22 will be described in more detail in connection with FIGS. 3 and 3A. Each one of the amplifier sections $\mathbf{24}_1$-$\mathbf{24}_M$ is fed by a corresponding one of signals I input_1 through I input_M, respectively, produced by a corresponding one of the transducer elements 14 and by signals produced by the log generator 22. An exemplary one of the amplifier sections is shown in, and will be described in more detail in connection, with FIG. 4. Suffice it to say here that log generator 22 includes a translinear loop 26, a current to voltage converter having a differential transistor pair 28, a current mirror feedback circuit 30 and a current mirror 32 arranged as will be described in connection with FIG. 3 to serve as a master circuit for producing: a pair of currents Ifb, Ic4 with a ratio proportional to the linear natural logarithmic function of an input gain signal, Iin, which is a function of $V_{tgc}$; and, a differential voltage, Vc-Vr. Each one of the amplifier sections $\mathbf{24}_1$-$\mathbf{24}_M$ includes: (a) a replica of a portion of the master circuit and is fed by the produced differential voltage (Vc-Vr) to thereby produce a replica of the pair of currents Ifb, Ic4 produced in the master circuit; and (b) an amplifier fed by the produced replicated pair of currents, such amplifier having a gain proportional to the ratio of such replicated currents. Thus, because the gain of the amplifier is proportional to the ratio of such replicated currents and since the ratio of the replicated pair of currents is proportional to the linear natural logarithmic function of the input gain signal, the gain of the amplifier varies proportionally with the linear natural logarithmic function of the input gain signal. The amplifier sections $\mathbf{24}_1$-$\mathbf{24}_M$ thereby amplify the input signals I input_1 through I input_M, respectively, to produce output signals I output_1 through I output_M, respectively, for processor 16.

Figure 3:
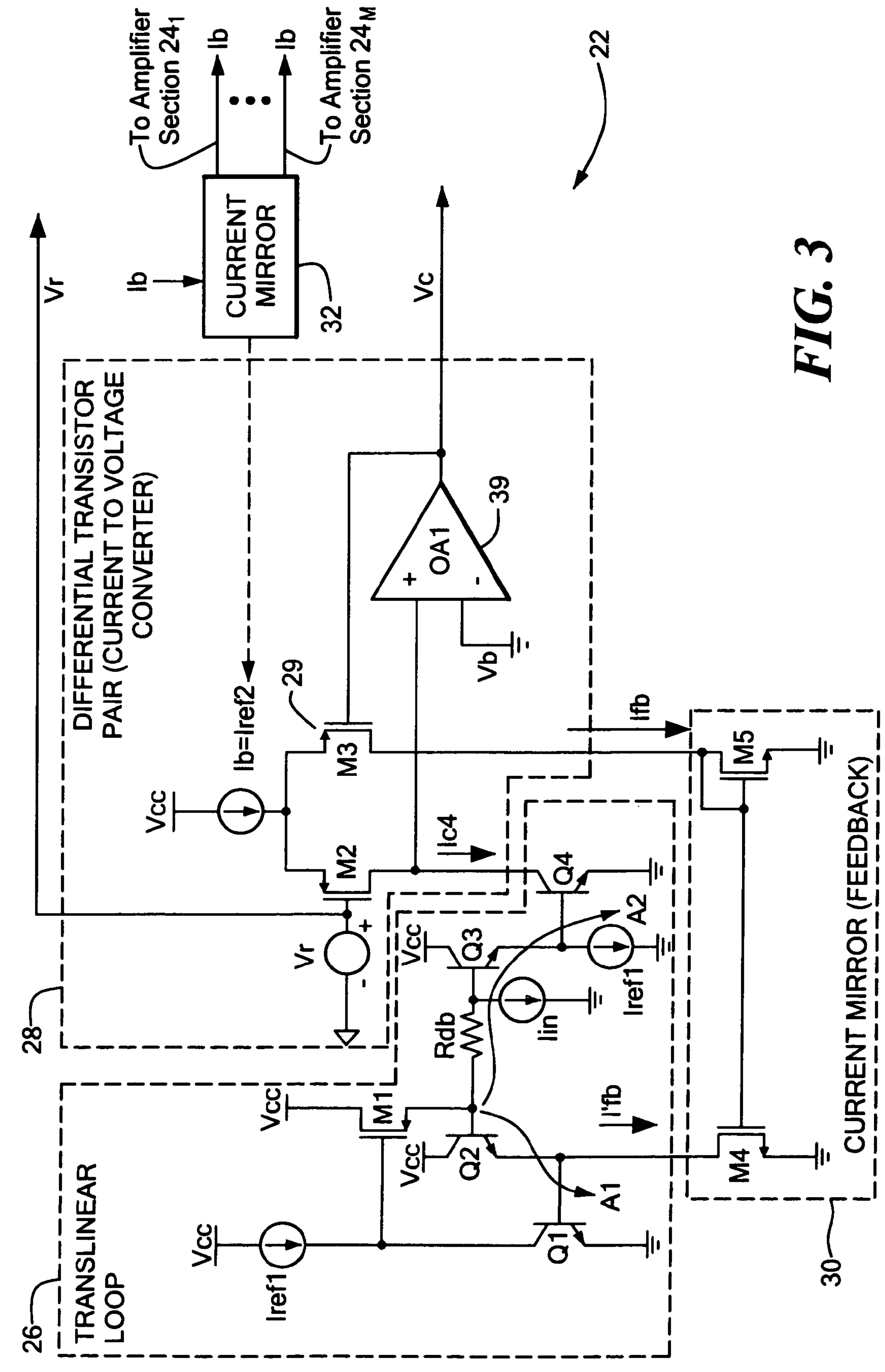
FIG. 3 is a diagram of a log function generator used in the system of FIG. 2 in accordance with the invention.

Referring now to FIG. 3, the log generator 22 is shown to include: the translinear loop 26, the current to voltage converter 28 having the differential transistor pair 29, the current mirror feedback circuit 30 and the current mirror 32.

The translinear loop 26 includes a first pair of BJTs Q1, Q2 and a second pair of BJTs Q3, Q4. The base electrode of transistors Q3 and Q4 are connected through a resistive device, here a resister Rdb. Thus, the PN junctions provided by the base-emitter junctions of BJTs Q1 and Q2 pass current indicated by arrow A1 in a counter-clockwise direction while the PN junctions provided by the base-emitter junctions of BJTs Q3 and Q4 pass current indicated by arrow A2 in a clockwise direction.

A first reference current source, Iref1, is fed to the collector electrode of grounded emitter transistor Q1. A first FET, M1, has its gate (i.e., control) electrode connected to the collector of transistor Q1. The FET, M1, has source and drain electrodes connected between Vcc and the base electrode of transistor Q2. Further, the input signal, i.e., the current Iin, is shown as a current source and is connected to the base of transistor Q3, such transistor having its collector coupled to Vcc. It is noted that the amount of current through Iin is a function of the gain desired by the amplifier section 24 (FIG. 2) and is selected by the processor 16 (FIG. 2). Thus, Iin is a variable.

The current Iref1 is mirrored to the emitter of transistor Q4. The emitter of transistors Q2 passes a current I'fb fed thereto by a feedback circuit 30 (e.g., a current mirror) by the current to voltage converter 28 in a manner to be described. Suffice it to say here, that transistors Q1, Q2, Rdb, Q3, and Q4 form a translinear loop which obeys Kirchoff's voltage law. The principle of translinearity states that, in a closed loop containing an equal number of oppositely connected translinear elements, the product of the current densities in the elements connected in the clockwise direction is equal to the corresponding product for elements connected in the counterclockwise direction, see Barrie Gilbert, Current-mode Circuits From a Translinear Viewpoint, in CURRENT-MODE ANALOG INTEGRATED CIRCUIT DESIGN 11-91, (C. Toumazou et al. eds. 1990); B. Gilbert, "Translinear circuits: A proposed classification". Electronics Letters, 11(10, pp 14-16, 1975, errata, 111 (60 p. 136, and, Translinear Circuits in Subthreshold MOS by Andreas G. Andreou and Kwabena A. Boahen published in "Analog Integrated Circuits and Signal Processing", An International Journal, Volume 9, No. 2, March 1996. Thus, for a loop of PN junctions, (e.g., the base emitter junction of a bipolar junction transistor with its exponential I-V characteristics), the principle may be stated as: for a closed loop of PN junctions, the sum of all voltages in the clockwise direction, A2, is equal to the sum in the counter-clockwise direction, A1.

Thus, for the translinear circuit 26 shown in FIG. 3, the sum of voltages around the loop is zero.

$$vbe1+vbe2-IinRdb-vbe3-vbe4=0$$

Substituting the bipolar transistor equation $$\left(\text{i.e., } I = Is_0 e^{\frac{Vcc-Vbe}{Vt}}\right)$$

for the voltage and assuming all of the saturation currents for the bipolar transistors are equal, the equation becomes $$Vt\ln\left(\frac{Ic1\cdot Ic2}{Ic3\cdot Ic4}\right) = -Iin\cdot Rdb,$$

where:

ln is the natural logarithmic function; and

Ic1, Ic2, Ic3 and Ic4, are collector currents of their respective bipolar transistors Q1, Q2, Q3, and Q4.

Since the collector currents are approximately equal to the emitter current, the equation can be put in terms of the Iref1 and I'fb $$Vt\ln\left(\frac{Iref1\cdot I'fb}{Iref1\cdot Ic4}\right) = -Iin\cdot Rdb$$

-continued $$Vt\ln\left(\frac{I'fb}{Ic4}\right) = -Iin\cdot Rdb$$

Thus, Ic4 is exponentially related to the input current and is given as $$\frac{Ic4}{I'fb} = e^{\frac{Iin\cdot Rdb}{Vt}}$$

The log generator 22 includes, as noted above, the current to voltage converter 28. The converter 28 includes a differential transistor par FETs M2 and M3. Each one of the transistors M2, M3 in the differential pair has a control electrode (e.g., a gate electrode) for controlling carriers between a first electrode thereof and a second electrode thereof, i.e., between the source and drain electrodes of the transistor). The first electrodes of the pair, here the drain electrodes, are fed a common current, here the second reference current Ib. The control electrode of a first one of the pair of transistors, here M3, is adapted for connection to a first reference potential, here the voltage Vr.

The current feedback circuit 30 is fed by a first current, Ifb, passing through the second electrode of one of the pair of transistors M2, M3, here transistor M3, to produce a corresponding feedback current, I'fb which passes through transistor Q2 in the translinear loop 26. Thus, the translinear loop 26 is fed by both the input signal Iin and the feedback current I'fb and produces a second current Ic4 through a second electrode of another one of the pair of transistors, here M2, proportional to the natural logarithm of the input signal, Iin. The first and second currents Ic4, Ifb, provide the pair of currents having the ratio proportional to the natural logarithm of the input signal. A control circuit 39 having an operational amplifier OA1 reference to potential Vb and having its other input connected to the second electrode of one of the transistors M2, M3, here transistor M2, is provided for controlling the control electrode of the second one of the pair of transistors, M3, to a second potential, here the potential Vc, in response to one of the pair of currents, here to current Ic4. Thus, the current Ic4 is encoded or converted into the voltage Vr.

It is noted that the feedback amplifier OA1 biases the transistor Q4 into its linear operating region and because of the current feedback circuit 30, the current through M3, Ifb, is related to Ic4 by $$Ifb=(Ib-Ic4)$$

Thus, because the current, I'fb, through Q3 is made equal to the current, Ifb, through M3 by using a current mirror feedback circuit 30 and the control circuit 39, the previous equation becomes $$\frac{Ic4}{(Ib-Ic4)} = e^{\frac{Iin\cdot Rdb}{Vt}}$$

We can rewrite the equation as $$\frac{Ic4}{Ifb} = Gv = \cdot e^{\frac{Iin \cdot Rdb}{Vt}}$$

$$Gv|_{dB} = \left[\frac{20 \cdot Rdb \cdot \log(e)}{Vt} Iin\right]$$

As will be described in connection with FIG. 4, and as noted briefly above, each one of the amplifier sections $\mathbf{24}_1$-$\mathbf{24}_M$ has an amplifier with a gain related to the ratio of Ic4/[Ib-Ic4]. Thus, the gain of such amplifier will change exponentially, (i.e., will change as linear natural logarithmic function) of the control signal Iin. This means the gain will have a constant slope in decibels.

Figure 1:
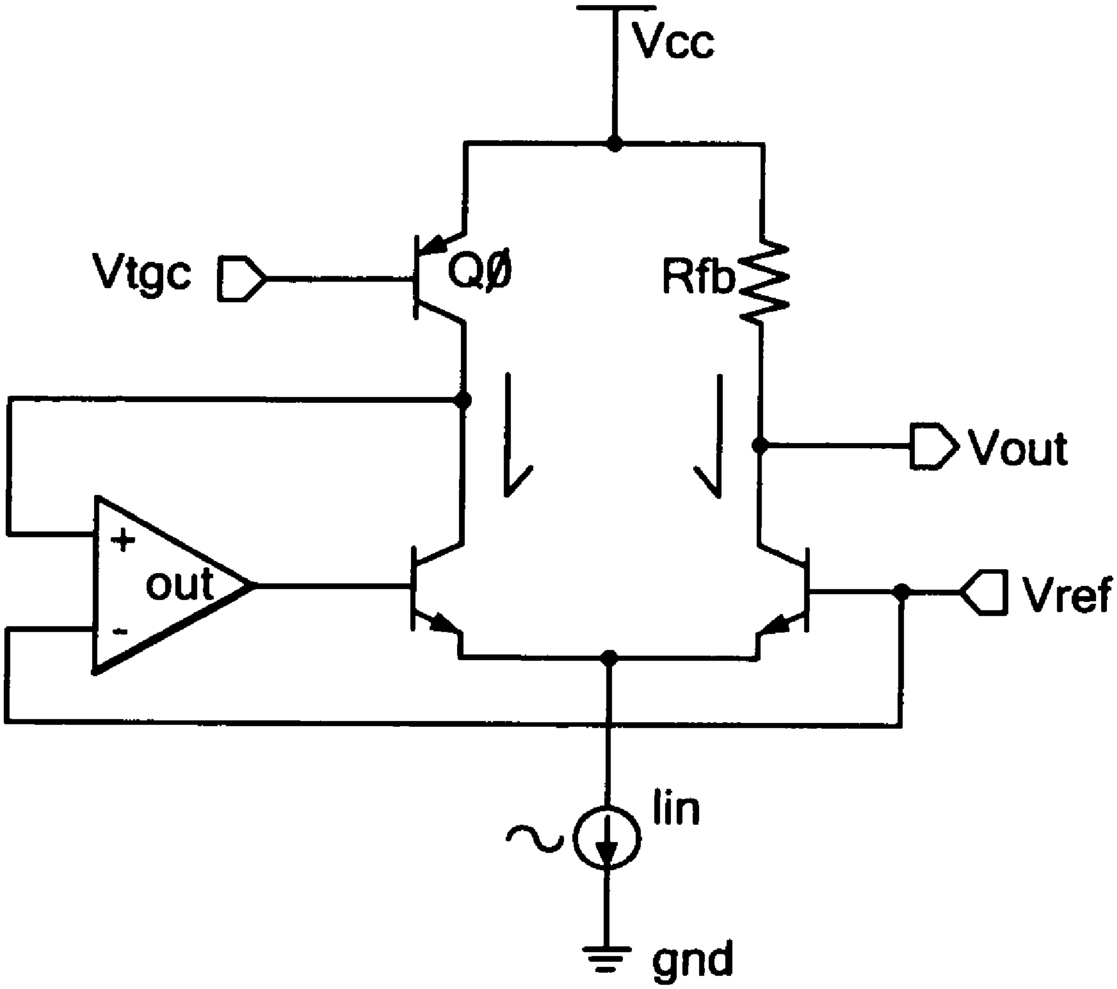
FIG. 1 PRIOR ART
FIG. 1 is a circuit according to the PRIOR ART.

In order to reduce the number of conductors on the chip 20 (FIG. 1), rather than feed two currents, Ic4 and Ifb, to each of the M amplifier sections $\mathbf{24}_1$-$\mathbf{24}_M$ a replication of the differential pair of transistors M2, M3 used to generate Ifb and Ic4 is provided on the same chip 20 local to each one of the amplifier sections $\mathbf{24}_1$-$\mathbf{24}_M$. Each one of the M replicated differential pair of transistors is fed with the same voltages Vc and Vr and one current, the second reference current Ib used in the log generation circuit 22. Thus, each one of the M replicated differential pair of transistors will provide the same pair of current Ic4 and Ib-Ic4 locally at corresponding one of the M amplifier sections $\mathbf{24}_1$-$\mathbf{24}_M$ so that each one of the M amplifier sections $\mathbf{24}_1$-$\mathbf{24}_M$ will produce the gain Gv.

Figure 4:
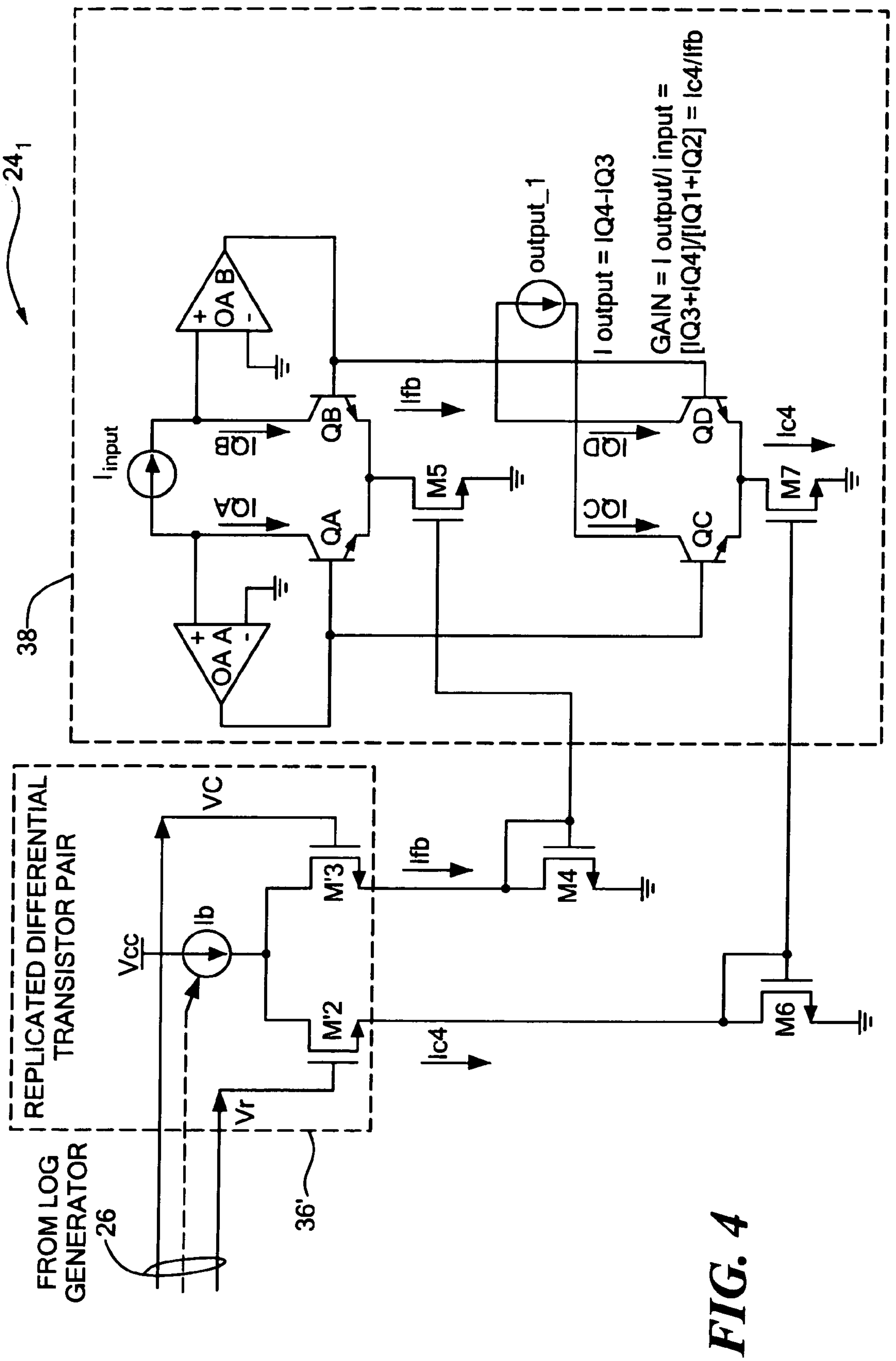
FIG. 4 is a diagram of an exemplary amplification section used in the system of FIG. 2 in accordance with the invention.

More particularly, referring to FIG. 4, an exemplary one of the amplifier sections $\mathbf{24}_1$-$\mathbf{24}_M$ is shown to include a pair of transistors M'2, M'3 matched to the transistors M2, M3 respectively in the log generator 22 and are arranged as shown as a differential pair of transistors 36' to thereby provide a replicated differential pair of transistors 36'. Thus, each one of the transistors M'2, M'3 in the replicated differential pair 36' has a control electrode (e.g., a gate electrode) for controlling carriers between a first electrode thereof and a second electrode thereof, i.e., between the source and drain electrodes of the transistor. The first electrodes of the pair, here the drain electrodes, are fed a common current, here the second reference current Ib. The control electrode of a first one of the pair of transistors, here M'3, is connected to the voltage Vc produced in the log generator circuit 22 by amplifier OA1 and the control electrode of the other one of the pair of transistors, here M'2, is connected to the reference voltage Vr also used in the log generator circuit 22. It follows that the current through transistor M'2 will be Ic4 and the current through transistor M'3 will be Ifb.

The exemplary one of the amplifier sections $\mathbf{24}_1$-$\mathbf{24}_M$, here amplifier section $\mathbf{24}_1$, is shown to include a conventional amplifier 38 adapted to provide a gain linear proportional to the ratio of a pair of currents fed thereto. As will be described, the pair of currents is Ifb and Ic4. Thus, the amplifier 38 provides a gain to an input signal, here a differential current I input_1 produced by the one of the transducers 14 fed thereto, the output of such amplifier 38 I output being feed to the processor 16, FIG. 2.

More particularly, the amplifier 38 includes a first differential pair of BJT transistors QA, QB having collector electrodes fed a differential current (IQA-IQB) produced by the one of the transducers 14 fed thereto as the current I input_1 as shown in FIG. 2. The voltages at the base electrodes of the transistors QA and QB are controlled by operational amplifiers OA A and OA B, respectively, in the feedback arrangement shown. The current through both transistors QA and QB is, because of the current mirrors provided by FETs M4 and M5, Ifb, i.e., IQA+IQB=Ifb. It is noted that amplifier 38 may be arranged differently and other configurations may be used to provide an amplifier having a gain linear proportional to the ratio of a pair of currents fed thereto.

The amplifier 38 includes a second differential pair of BJT transistors QC, QC having collector electrodes which provide a differential current (IQC-IQD), such differential current being the output of the amplifier 38, I output_1 which is fed to the processor 16 (FIG. 2). The voltages at the base electrodes of the transistors QC and QD are controlled by the operational amplifiers OA A and OA B, respectively, as shown. The current through both transistors QC and QD is, because of the current mirrors provided by FETs M6 and M7, Ic4, i.e., IQC+IQD=Ic4.

Thus, $$vbeA - vbeB = vbC - vbeD$$

where: vbeA, vbeb, vbeC and vbeD, are the base to emitter voltages of transistors QA, QB, QC and QD, respectively.

Thus, $$iinput = IQA - IQB = Ia \cdot \tanh\left(2\frac{vbeA - vbeB}{Vt}\right)$$

$$\begin{aligned} ioutput &= IQC - IQD \\ &= Ib \cdot \tanh\left(2\frac{vbeC - vbeD}{Vt}\right) \\ &= Ib \cdot \tanh\left(2\frac{vbeA - vbeB}{Vt}\right) \end{aligned}$$

$$Vt = \text{Thermal Voltage}$$

$$\frac{ioutput}{iinput} = \frac{Ib}{Ia}$$

where Ib and Ia are the currents through M7 and M5, respectively.

Thus, $$\frac{ioutput}{iinput} = \frac{Ic4}{Ifb} = Gv = e^{\frac{Iin \cdot Rdb}{Vt}}$$

$$Gv|_{dB} = \frac{20 \cdot Rdb \cdot \log(e)}{Vt} Iin$$

Thus, it is noted that the current Ic4 and Ifb are encoded into a differential voltage (Vr-Vc). This differential voltage together with the reference current Ib are fed to a replicated differential pair of transistors 36 which then decodes these signals (i.e., the differential voltage and Ib) into the pair of currents having a ratio Ic4/Ifb. Each one of the amplifiers 38 is fed a corresponding one of the replicated currents Ic4 and Ifb for amplifier 38.

Figure 3A:
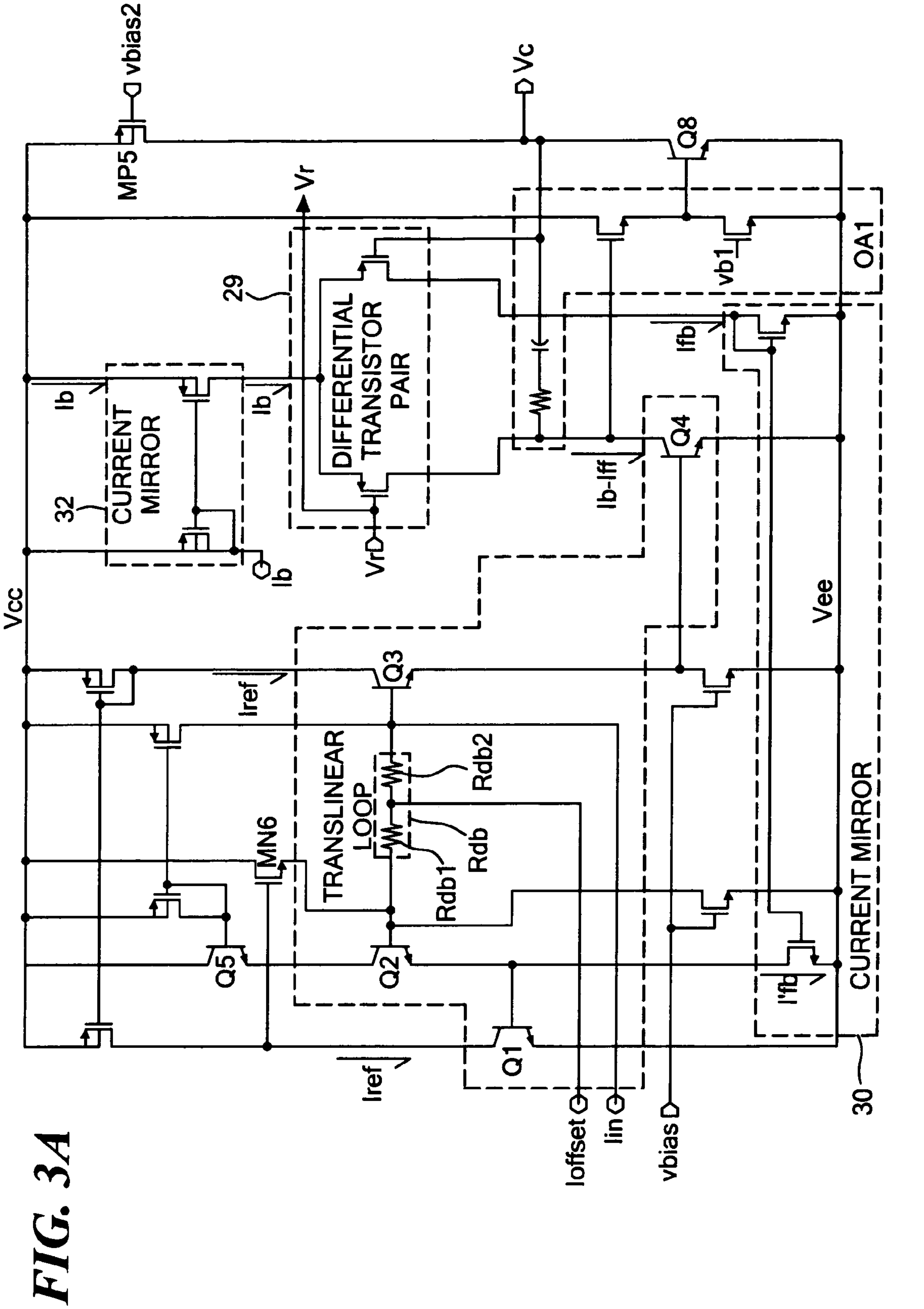
FIG. 3A is a more detailed diagram of the log function generator of FIG. 3.

A more detailed diagram of the log generator circuit 22 is shown in FIG. 3A. Here, the resistor Rdb is made up of two separate resistors Rdb1 and Rdb2. The junction between the two resistors Rdb1 and Rdb2 is adapted for coupling to an offset current source Ioffset. Thus, with such circuit:

$$\frac{Ic4}{Ifb} = Gv = e^{\frac{Rdb1(Iin)+Rdb2(Iin+Ioffset)}{Vt}}$$

Figure 5:
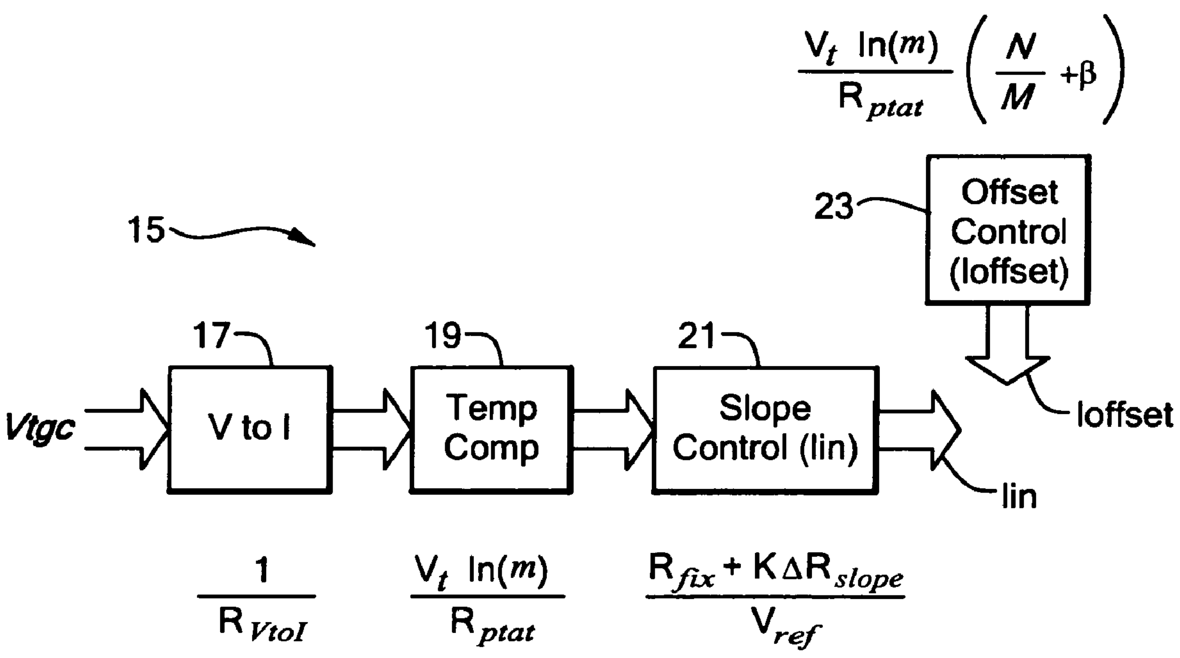
FIG. 5 is a block diagram of a pre-processor used in the log function generator of FIG. 2.

Referring now to FIG. 5, the pre-processor 15, here an analog circuit, is used to provide temperature compensation and slope control in generating the input signal Iin and to generate any requisite bias Ioffset signal as shown in FIG. 3A. Thus, the processor 16 (FIG. 2) provides an analog voltage Vtgc to the pre-processor 15. The voltage is converted to a corresponding current by a resistor circuit 17 having a transfer function $1/R_{vtol}$. A conventional temperature compensation circuit 19 is used to produce an output proportional to absolute zero temperature. The transfer function of temperature compensation circuit 19 is $V_t \ln(m)/R_{ptat}$, where $V_t$=kT/q, m is a constant, T is the temperature of the chip k is Boltzman's constant, and In is the natural logarithm function. Slope control is provided by a slope control circuit 21 having a transfer function: $[R_{fix}+K\Delta R_{slope}]/V_{ref}$, where $R_{fix}$ is a constant resistance, $K\Delta R_{slope}$ variable resistance which can vary by several methods. These methods include digitally programmable tuning switches, fused resistor links, etc. $V_{ref}$ is a constant voltage reference provided to the circuit 21 by the processor 16 (FIG. 2). The output of the circuit 21 is Iin described above. An offset circuit 23 is provided having a transfer function: $[V_t \ln(m)/R_{ptat}][(N/M)+\beta]$ where:

N and M are programmable integers $\beta$ is an offset constant designed to allow enough headroom for offset adjustments using N and M.

This provides the offset Ioffset shown in FIG. 3A.

The function of the pre-processor 15 is used to calibrate the system by providing any requisite slope and offset adjustments as well as temperature compensation.

A number of embodiments of the invention have been described. Nevertheless, it will be understood that various modifications may be made without departing from the spirit and scope of the invention. For example, the log generation circuit 22 may be used in other application than transducer array systems. For example, while the ratio of I'fb/Ifb is in the embodiment described above is one, in the more general case, the feedback current, Ifb, may be multiplied by a predefined gain, $\alpha$. Thus, the ratio of gate width, W, to gate length, L, for transistor M4 to the ratio of gate width, W, to gate length, L, for transistor M5 is $\alpha$. In such case:

$$Gv|_{dB} = \left[\frac{20 \cdot Rdb \cdot \log(e)}{Vt} Iin\right] + [20 \cdot \log(\alpha)]$$

Accordingly, other embodiments are within the scope of the following claims.

What is claimed is:

1. A circuit for producing a pair of currents having a ratio proportional to the natural logarithm of an input signal, comprising:

a differential pair of transistors, each one of the transistors having a control electrode for controlling carriers between a first electrode thereof and a second electrode thereof, the first electrodes of the pair being fed a common current, the control electrode of a first one of the pair of transistors being adapted for connection to a first reference potential;

a control circuit for controlling the control electrode of the second one of the pair of transistors to a second potential;

a current feedback circuit fed by a first current passing through the second electrode of one of the pair of transistors for producing a corresponding feedback current;

a translinear loop, fed by the input signal and the feedback current, for producing a second current through the second electrode of another one of the pair of transistors proportional to the natural logarithm of the input signal; and wherein the first and second currents provide the pair of currents having the ratio proportional to the natural logarithm of the input signal.

2. The circuit recited in claim 1 wherein the translinear loop comprises a first PN junction connected to a second PN junction through a resistive element, such resistive element passing therethrough an input current, such input current providing the input signal, a first one of the PN junctions passing the feedback current and a second one of the pair of PN junctions passing the second current.

3. The circuit recited in claim 2 wherein the control circuit includes a feedback loop responsive to one of the currents passing through the first one of the pair of PN junctions.

4. The circuit recited in claim 3 wherein the PN junctions are provided by bipolar junction transistors.

5. A system for producing a control signal to a plurality of amplifiers sections to vary the gain of each one of the plurality of amplifier sections as a linear natural logarithmic function of an input gain control signal, comprising:

a master circuit for producing a pair of currents with a ratio proportional to the linear natural logarithmic function of the input gain signal and a differential voltage; and wherein each one of the amplifier sections includes:

a replica of the a portion of the master circuit fed by the produced differential voltage for producing a replica of the pair of currents produced in the master circuit; and an amplifier fed by the produced replica of the pair of currents, such amplifier having a gain proportional to the ratio of such produced replica of the pair of currents.

6. The system recited in claim 5 wherein the master circuit comprises a differential transistor pair for producing the pair of currents through a differential transistor pair thereof with a ratio proportional to the linear natural logarithmic function of the input gain signal and the differential voltage between control electrodes of the differential transistor pair; and wherein each one of the amplifier sections includes:

(a) a replica of the differential transistor pair of the master circuit fed by the produced differential voltage for producing a replication of the pair of currents produced in the master circuit; and (b) an amplifier fed by the produced replicated currents, such amplifier having a gain proportional to the ratio of such replicated currents.

7. A system for producing a control signal to a plurality of amplifiers sections to vary the gain of each one of the plurality of amplifier sections as a linear natural logarithmic function of an input gain control signal, comprising:

a master circuit comprising:

a natural logarithmic function generator; and a differential transistor pair coupled to the generator and fed by a reference current; and feedback control circuitry; and wherein the master circuit produces a pair of currents through the differential transistor pair with a ratio proportional to the linear natural logarithmic function of the input gain signal and produces a differential voltage between control electrodes of the differential transistor pair; and wherein each one of the amplifier sections includes:

a replica of the differential transistor pair of the master circuit having control electrodes fed by the produced differential voltage and fed by the reference current for producing a replication of the pair of currents produced in the master circuit; and an amplifier fed by the produced replicated currents, such amplifier having a gain proportional to the ratio of such replicated currents.

8. A system recited in claim 7 wherein the master circuit comprises:

a differential pair of transistors, each one of the transistors having a control electrode for controlling carriers between a first electrode thereof and a second electrode thereof, the first electrodes of the pair being fed a common current, the control electrode of a first one of the pair of transistors being adapted for connection to a first reference potential;

a control circuit for controlling the control electrode of the second one of the pair of transistors to a second potential;

a current feedback circuit fed by a first current passing through the second electrode of one of the pair of transistors for producing a corresponding feedback current;

a translinear loop, fed by the input signal and the feedback current, for producing a second current through the second electrode of another one of the pair of transistors proportional to the natural logarithm of the input signal; and wherein the first and second currents provide the pair of currents having the ratio proportional to the natural logarithm of the input gain control signal.

9. The system recited in claim 8 wherein the translinear loop comprises a first PN junction connected to a second PN junction through a resistive element, such resistive element passing therethrough an input current, such input current providing the input signal, a first one of the PN junctions passing the feedback current and a second one of the pair of PN junctions passing the second current.

10. The system recited in claim 9 wherein the control circuit includes a feedback loop responsive to one of the currents passing through the first one of the pair of PN junctions.

11. The system recited in claim 10 wherein the PN junctions are provided by bipolar junction transistors.

* * * * *